United States Patent
Hirano et al.

(10) Patent No.: US 9,606,435 B2
(45) Date of Patent: Mar. 28, 2017

(54) METHOD FOR MANUFACTURING MICRO-STRUCTURE AND OPTICALLY PATTERNABLE SACRIFICIAL FILM-FORMING COMPOSITION

(71) Applicant: Shin-Etsu Chemical Co., Ltd., Tokyo (JP)

(72) Inventors: Yoshinori Hirano, Annaka (JP); Hideyoshi Yanagisawa, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/458,657

(22) Filed: Aug. 13, 2014

(65) Prior Publication Data

US 2014/0356790 A1    Dec. 4, 2014

Related U.S. Application Data (62) Division of application No. 13/474,795, filed on May 18, 2012, now Pat. No. 8,835,091.

(30) Foreign Application Priority Data

May 20, 2011    (JP) ................. 2011-113676

(51) Int. Cl.
- G03F 7/00 (2006.01)
- G03F 7/038 (2006.01)
- G03F 7/38 (2006.01)
- G03F 7/023 (2006.01)
- G03F 7/40 (2006.01)
- B81C 1/00 (2006.01)

(52) U.S. Cl.
CPC ........ G03F 7/0384 (2013.01); B81C 1/00111 (2013.01); G03F 7/00 (2013.01); G03F 7/023 (2013.01); G03F 7/0236 (2013.01); G03F 7/38 (2013.01); G03F 7/40 (2013.01); B81B 2203/0384 (2013.01); Y10S 430/122 (2013.01); Y10S 430/123 (2013.01)

(58) Field of Classification Search
CPC ...... G03F 7/0226; G03F 7/023; G03F 7/0236; G03F 7/38; Y10S 430/122; Y10S 430/123
USPC .......... 430/18, 320, 190, 192, 193, 326, 330
See application file for complete search history.

(56) References Cited

U.S. PATENT DOCUMENTS

| | | | |
|---|---|---|---|
| 5,008,175 A | 4/1991 | Hsieh et al. | |
| 5,084,372 A | 1/1992 | Hsieh et al. | |
| 5,759,740 A * | 6/1998 | Munzel et al. | 430/270.1 |
| 5,985,507 A * | 11/1999 | Blakeney | C08G 8/16 430/190 |
| 6,635,400 B2 * | 10/2003 | Kato | G03F 7/0233 430/170 |
| 6,790,582 B1 | 9/2004 | Eilbeck | |
| 7,132,213 B2 | 11/2006 | Masuda et al. | |
| 7,465,527 B2 | 12/2008 | Kon et al. | |
| 7,638,253 B2 | 12/2009 | Park et al. | |
| 8,785,114 B2 * | 7/2014 | Kato et al. | 430/325 |
| 8,835,091 B2 * | 9/2014 | Hirano et al. | 430/190 |
| 8,871,422 B2 * | 10/2014 | Minegishi | 430/270.1 |
| 2003/0047533 A1 | 3/2003 | Reid et al. | |
| 2010/0009482 A1 | 1/2010 | Park et al. | |
| 2011/0305990 A1 | 12/2011 | Kato et al. | |

FOREIGN PATENT DOCUMENTS

| | | |
|---|---|---|
| EP | 0 917 000 A2 | 5/1999 |
| EP | 1 471 540 A1 | 10/2004 |
| EP | 2 395 395 A2 | 12/2011 |
| JP | H11-352702 A | 12/1999 |
| JP | 2000-255072 A | 9/2000 |
| JP | 2010-20291 A | 1/2010 |
| JP | 2012-18390 A | 1/2012 |

OTHER PUBLICATIONS

Extended European Search Report for Patent Application No. 12167298.4, dated May 6, 2013.

* cited by examiner

*Primary Examiner* — John S Chu
(74) *Attorney, Agent, or Firm* — Birch, Stewart, Kolasch & Birch, LLP (57) ABSTRACT

A micro-structure is manufactured by patterning a sacrificial film, forming an inorganic material film on the pattern, and etching away the sacrificial film pattern through an aperture to define a space having the contour of the pattern. The patterning stage includes the steps of (A) coating a substrate with a composition comprising a cresol novolac resin, a crosslinker, and a photoacid generator, (B) heating to form a sacrificial film, (C) patternwise exposure, (D) development to form a sacrificial film pattern, and (E) forming crosslinks within the cresol novolac resin.

10 Claims, 1 Drawing Sheet

METHOD FOR MANUFACTURING MICRO-STRUCTURE AND OPTICALLY PATTERNABLE SACRIFICIAL FILM-FORMING COMPOSITION

This application is a Divisional of co-pending application Ser. No. 13/474,795 filed on May 18, 2012 which claims the benefit of Japanese Application No. 2011-113676 filed on May 20, 2011. The entire contents of all of the above applications are hereby expressly incorporated by reference.

TECHNICAL FIELD

This invention relates to a method for manufacturing a micro-structure, especially micro-electromechanical system (MEMS) element. More particularly, it relates to a method for manufacturing a micro-structure by a sacrificial layer etching technique including forming a sacrificial film pattern (or resin structure) on a substrate, depositing an inorganic material film on the sacrificial film pattern, optionally processing the inorganic material film into a predetermined shape, and etching away the sacrificial film pattern (or resin structure) to form a structure having a desired space. It also relates to an optically patternable sacrificial film-forming composition.

BACKGROUND ART

In the manufacture of MEMS elements having mechanical element parts such as sensors and actuators integrated on substrates, the predominant portion is processed using the semiconductor integrated circuit fabrication technology. For forming movable structure parts and stereo-structure parts, the MEMS technology utilizes inherent processing techniques such as sacrificial layer etching technique, deep drilling/etching technique, and anisotropic etching technique. Among these techniques, the sacrificial layer etching technique is an important technique involving depositing a plurality of layers on a substrate, and selectively removing the lower layer called sacrificial layer, leaving the upper layer. With respect to the materials used in the sacrificial layer, many reports have been made. For example, JP-A 2000-255072 discloses a positive novolac resist material which can be advantageously processed to form fine size features, but has poor heat resistance, by which a choice of the material of the upper layer is limited.

CITATION LIST

Patent Document 1: JP-A 2000-255072

SUMMARY OF INVENTION

In connection with the sacrificial layer etching technique which is a predominant stage of the MEMS device fabrication, an object of the invention is to provide a method for manufacturing a micro-structure and a sacrificial film-forming composition, which can form a sacrificial film pattern having a pattern profile and heat resistance sufficient to accept the deposition of silicon or metal material at high temperature and hence, can form a high-accuracy micro-structure.

Regarding an optically patternable sacrificial film-forming composition, the inventors attempted to use a material providing a high resolution, to select such a material that the profile of a sacrificial film pattern may not be inversely tapered, and to impart heat resistance to the material. The inventors found that a sacrificial film pattern having the desired performance is obtainable using a material and process as defined below.

In JP-A 2012-018390 (US 20110305990, EP 2395395A2), the inventors/applicant already proposed a method for manufacturing a micro-structure, using an optically patternable sacrificial film-forming composition comprising (A-1) a cresol novolac resin having some or all phenolic hydroxyl groups esterified with 1,2-naphthoquinonediazidosulfonic acid ester, or a cresol novolac resin having some or all phenolic hydroxyl groups esterified with 1,2-naphthoquinonediazidosulfonic acid ester and a cresol novolac resin having phenolic hydroxyl groups non-esterified, (A-2) the novolac resin (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester, and a crosslinker capable of forming crosslinks within the cresol novolac resin in the presence of an acid catalyst. It has been found that when a photoacid generator having the highest absorption peak in the wavelength range of 200 to 300 nm is added to this composition, the composition is improved in yield and reproducibility and a sacrificial film having a high degree of control can be formed while maintaining the high accuracy and performance of micro-structure.

Accordingly, in one aspect, the invention provides a method for manufacturing a micro-structure comprising the stages of (i) processing a sacrificial film on a substrate to form a sacrificial film pattern, (ii) forming an inorganic material film on the sacrificial film pattern, (iii) providing a portion of the inorganic material film with an aperture for etching, and (iv) etching away the sacrificial film pattern through the aperture to form a space having the contour of the sacrificial film pattern, wherein the stage (i) of forming a sacrificial film pattern includes the steps of:

(A) coating the substrate with a sacrificial film-forming composition comprising (A-1) (i) a cresol novolac resin having some or all phenolic hydroxyl groups esterified with 1,2-naphthoquinonediazidosulfonic acid halide, or (ii) a mixture of a cresol novolac resin having some or all phenolic hydroxyl groups esterified with 1,2-naphthoquinonediazidosulfonic acid halide and a cresol novolac resin having phenolic hydroxyl groups non-esterified, (A-2) the novolac resin (i) or novolac resin mixture (ii) as component (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester, a crosslinker capable of forming crosslinks within the cresol novolac resin in the presence of an acid catalyst, and a photoacid generator having the highest absorption peak in the wavelength range of 200 to 300 nm, (B) heating the sacrificial film-forming composition on the substrate to form an optically patternable sacrificial film of 2 to 20 μm thick, (C) exposing the sacrificial film to first high-energy radiation in accordance with a pattern layout image, (D) developing the sacrificial film in an alkaline developer to form a positive sacrificial film pattern, and (E) exposing the sacrificial film pattern to second high-energy radiation which is ultraviolet radiation covering a wavelength of 254 nm, for thereby forming crosslinks within the cresol novolac resin in the sacrificial film pattern.

In one preferred embodiment, step (E) includes exposing the sacrificial film pattern to UV radiation covering a wavelength of 254 nm while heating at a temperature in the range of 30 to 220° C.; or exposing the sacrificial film pattern to UV radiation covering a wavelength of 254 nm and then heating at a temperature in the range of 100 to 220° C.; or exposing the sacrificial film pattern to UV radiation covering a wavelength of 254 nm while heating at a temperature in the range of 30 to 220° C., and further heating at a temperature in the range of 100 to 220° C.

In one preferred embodiment, the cresol novolac resin used in the sacrificial film-forming composition or a cresol novolac resin from which the cresol novolac resin having phenolic hydroxyl groups esterified is derived is a cresol novolac resin containing at least 40 mol % of p-cresol and having a weight average molecular weight of 2,000 to 30,000 and a melting temperature of at least 130° C.

In another preferred embodiment, the cresol novolac resin having some or all phenolic hydroxyl groups esterified with 1,2-naphthoquinonediazidosulfonic acid halide is a cresol novolac resin in which 0.5 to 30 mol % of phenolic hydroxyl groups are esterified with 1,2-naphthoquinonediazidosulfonic acid halide.

In a further preferred embodiment, the sacrificial film-forming composition comprises 45 to 98% by weight of component (A-1), (A-2) or (A-3), based on the total solids weight of the composition, and the total of the esterified cresol novolac resin and the non-esterified cresol novolac resin is at least 67% by weight of component (A-1), (A-2) or (A-3).

In a preferred embodiment, the crosslinker is a melamine compound or glycoluril compound and is present in an amount of 2 to 30% by weight based on the total solids weight of said sacrificial film-forming composition. More preferably, the melamine compound comprises at least 80% by weight of a hexamethoxymethylmelamine monomer.

In a preferred embodiment, the photoacid generator having the highest absorption peak in the wavelength range of 200 to 300 nm comprises a photoacid generator having an absorption coefficient ratio $A_{<300}/A_{>300}$ of at least 2.0 wherein $A_{<300}$ is an absorption coefficient at a wavelength providing the highest light absorption in the wavelength range of 200 to 300 nm and $A_{>300}$ is an absorption coefficient at a wavelength providing a maximum light absorption in a wavelength range in excess of 300 nm.

In a preferred embodiment, the sacrificial film-forming composition is such that the sacrificial film pattern resulting from step (E) of the pattern forming stage (i) has a sidewall which is forward tapered at an angle from 85° to less than 90° relative to the substrate.

In another aspect, the invention provides an optically patternable sacrificial film-forming composition comprising (A-1) (i) a cresol novolac resin having some or all phenolic hydroxyl groups esterified with 1,2-naphthoquinonediazidosulfonic acid halide, or (ii) a mixture of a cresol novolac resin having some or all phenolic hydroxyl groups esterified with 1,2-naphthoquinonediazidosulfonic acid halide and a cresol novolac resin having phenolic hydroxyl groups non-esterified, (A-2) the novolac resin (i) or novolac resin mixture (ii) as component (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester, a crosslinker capable of forming crosslinks within the cresol novolac resin in the presence of an acid catalyst, and a photoacid generator having the highest absorption peak in the wavelength range of 200 to 300 nm.

In a preferred embodiment, the cresol novolac resin in (A-1), (A-2) or (A-3) or a cresol novolac resin from which the cresol novolac resin having phenolic hydroxyl groups esterified is derived is a cresol novolac resin containing at least 40 mol % of p-cresol and having a weight average molecular weight of 2,000 to 30,000 and a melting temperature of at least 130° C.

In a preferred embodiment, the cresol novolac resin having some or all phenolic hydroxyl groups esterified with 1,2-naphthoquinonediazidosulfonic acid halide is a cresol novolac resin in which 0.5 to 30 mol % of phenolic hydroxyl groups are esterified with 1,2-naphthoquinonediazidosulfonic acid halide.

In a preferred embodiment, the sacrificial film-forming composition comprises 45 to 98% by weight of component (A-1), (A-2) or (A-3), based on the total solids weight of the composition, and the total of the esterified cresol novolac resin and the non-esterified cresol novolac resin is at least 67% by weight of component (A-1), (A-2) or (A-3).

In a preferred embodiment, the crosslinker is a melamine compound and said sacrificial film-forming composition comprises 2 to 30% by weight of the melamine compound based on the total solids weight of the composition. More preferably the melamine compound comprises at least 80% by weight of a hexamethoxymethylmelamine monomer.

In a preferred embodiment, the photoacid generator having the highest absorption peak in the wavelength range of 200 to 300 nm comprises a photoacid generator having an absorption coefficient ratio $A_{<300}/A_{>300}$ of at least 2.0 wherein $A_{<300}$ is an absorption coefficient at a wavelength providing the highest light absorption in the wavelength range of 200 to 300 nm and $A_{>300}$ is an absorption coefficient at a wavelength providing a maximum light absorption in a wavelength range in excess of 300 nm.

In the specification, the term "micro-structure" refers to structures in which various three-dimensional components are formed on a surface of silicon, glass or similar substrates. Exemplary micro-structures include parts to constitute various devices, such as pressure sensors and digital micromirror devices (DMD), as mounted on automobiles, as well as surface acoustic wave (SAW) filters and printer heads for inkjet printers.

ADVANTAGEOUS EFFECTS OF INVENTION

The method for manufacturing a micro-structure according to the invention is effective for forming a sacrificial film pattern having a high-accuracy, defective loss-free planar shape, an appropriate sidewall shape with an angle of 85° to less than 90°, and improved heat resistance.

DESCRIPTION OF EMBODIMENTS

In the disclosure, the singular forms "a," "an" and "the" include plural referents unless the context clearly dictates otherwise. The abbreviation "MEMS" stands for microelectromechanical system, "UV" for ultraviolet, "Mw" for weight average molecular weight, and "PAG" for photoacid generator.

The invention pertains to a method for manufacturing a micro-structure which may be advantageously used in the fabrication of MEMS components by surface micromachining. When a cavity or space is formed by surface micromachining, the desired micro-structure is manufactured by the stages of:

(i) processing a sacrificial film on a substrate to form a sacrificial film pattern, (ii) forming an inorganic material film on the sacrificial film pattern, (iii) providing a portion of the inorganic material film with an aperture for etching, and (iv) etching away the sacrificial film pattern through the aperture to form a space having the contour of the sacrificial film pattern.

According to the surface micromachining process, an inorganic material film is formed in stage (ii) on the sacrificial film pattern resulting from stage (i) as described above, yielding a wall structure for defining the cavity or space to be formed in the micro-structure. If the sacrificial film pattern has an inversely tapered wall at this point of time, it is difficult to deposit the inorganic material without leaving gaps. It is then impossible to accurately control the cavity or space-surrounding wall structure. For this reason, the sacrificial film pattern should have a forward tapered wall when stage (ii) is carried out.

Figure 1:
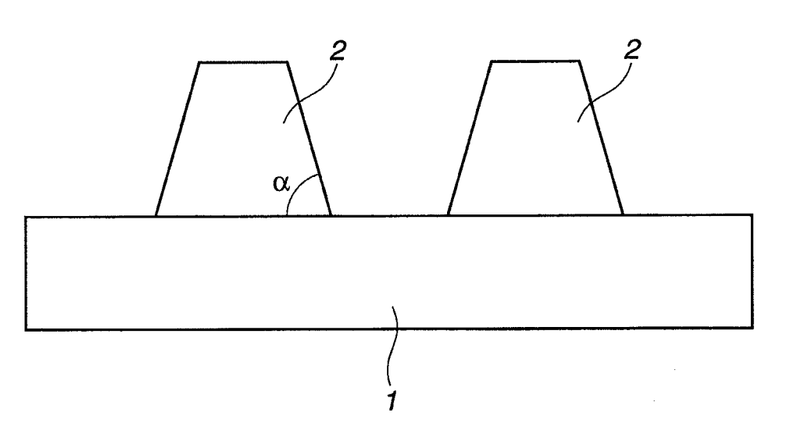
FIG. 1 is a cross-sectional view of a positive resist pattern.

The inventors have found that when stage (i) uses a specific positive photosensitive material to form a sacrificial film and patterns it by an appropriate process to be described later, a sacrificial film pattern that permits high temperature conditions to be applied in stage (ii) is obtainable. It is desirable that the sidewall of the sacrificial film pattern is as perpendicular as possible when a finer, more accurate microstructure is to be manufactured. In forming a pattern using a photosensitive material film, even in the case of a photosensitive material film having a relatively great thickness of 2 to 20 μm, a choice of a specific material for the film is successful in forming a sacrificial film pattern 2 on a substrate 1 such that the sidewall of pattern 2 may have a limited angle a of from 85° to less than 90° as shown in FIG. 1. Subsequent specific processing of the sacrificial film pattern imparts heat resistance at a temperature of at least 200° C. while maintaining the sidewall angle in the range of from 85° to less than 90°.

Now stage (i) of forming a sacrificial film pattern is described in detail. Stage (i) includes the steps of:

(A) coating a substrate with a sacrificial film-forming composition comprising (A-1) (i) a cresol novolac resin having some or all phenolic hydroxyl groups esterified with 1,2-naphthoquinonediazidosulfonic acid halide, or (ii) a mixture of a cresol novolac resin having some or all phenolic hydroxyl groups esterified with 1,2-naphthoquinonediazidosulfonic acid halide and a cresol novolac resin having phenolic hydroxyl groups non-esterified, (A-2) the novolac resin (i) or novolac resin mixture (ii) as component (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester, a crosslinker capable of forming crosslinks within the cresol novolac resin in the presence of an acid catalyst, and a photoacid generator having the highest absorption peak in the wavelength range of 200 to 300 nm, (B) heating the sacrificial film-forming composition on the substrate to form an optically patternable sacrificial film of 2 to 20 μm thick, (C) exposing the sacrificial film to first high-energy radiation in accordance with a pattern layout image, (D) developing the sacrificial film in an alkaline developer to form a positive sacrificial film pattern, and (E) exposing the sacrificial film pattern to second high-energy radiation which is UV radiation covering a wavelength of 254 nm, for thereby forming crosslinks within the cresol novolac resin in the sacrificial film pattern. Preferably, step (E) includes exposing the sacrificial film pattern to UV radiation covering a wavelength of 254 nm while heating at a temperature in the range of 30 to 220° C.; or exposing the sacrificial film pattern to UV radiation and then heating at a temperature in the range of 100 to 220° C.; or exposing the sacrificial film pattern to UV radiation while heating at a temperature in the range of 30 to 220° C., and further heating at a temperature in the range of 100 to 220° C.

For the optically patternable sacrificial film-forming composition used in step (A), any of positive novolac resist compositions, well known for use in the i- or g-line lithography, comprising a naphthoquinonediazidosulfonic acid ester as an optically active structure may be used as the base. Adding a specific crosslinker and photoacid generator to the novolac resist composition yields the sacrificial film-forming composition. In subsequent stage (ii) where an inorganic material film is deposited on the sacrificial film, it is impossible to form an accurately controlled space if the sacrificial film pattern has an inversely tapered sidewall. The use of a positive photosensitive material prevents the sacrificial film pattern from becoming inversely tapered.

The positive novolac resist compositions which are used as the base for the optically patternable sacrificial film-forming composition are known from many patent documents. The main components are a cresol novolac resin known as binder resin and a naphthoquinonediazidosulfonic acid ester. The naphthoquinonediazidosulfonic acid ester may be in integral form with the cresol novolac resin wherein the sulfonic acid ester bonds, in part or in entirety, with the cresol novolac resin via an ester bond. In case the naphthoquinonediazidosulfonic acid ester bonds in entirety with the cresol novolac resin, the cresol novolac resin material is equated with the naphthoquinonediazido ester material. Specifically, a material combination of cresol novolac resin with naphthoquinonediazidosulfonic acid ester may be:

(A-1) (i) a cresol novolac resin having some or all phenolic hydroxyl groups esterified with 1,2-naphthoquinonediazidosulfonic acid halide (exemplary of the halide being chloride and bromide), or (ii) a mixture of a cresol novolac resin having some or all phenolic hydroxyl groups esterified with 1,2-naphthoquinonediazidosulfonic acid halide and a cresol novolac resin having phenolic hydroxyl groups non-esterified, (A-2) the novolac resin (i) or novolac resin mixture (ii) as component (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester.

In a preferred embodiment, component (A-1), (A-2) or (A-3) is present in an amount of 45 to 98%, more preferably 70 to 98% by weight based on the total solids weight of the sacrificial film-forming composition, and the total of the esterified cresol novolac resin and the non-esterified cresol novolac resin is preferably at least 67% by weight, specifically 67 to 100% by weight of component (A-1), (A-2) or (A-3). Particularly in component (A-2) or (A-3), the total of the esterified cresol novolac resin and the non-esterified cresol novolac resin is preferably 67 to 99% by weight, more preferably 75 to 99% by weight. Component (A-1) is preferred among (A-1), (A-2) and (A-3).

Since the sacrificial film-forming composition must fulfill both a high resolution and a propensity to experience only a little geometric change during the crosslinking step, the cresol novolac resin used therein should preferably have a weight average molecular weight (Mw) of 2,000 to 30,000, more preferably 3,000 to 20,000, as measured by gel permeation chromatography (GPC) versus polystyrene standards. The cresol novolac resin is preferably one prepared from a cresol reactant containing at least 40 mol %, more preferably at least 45 mol % of p-cresol. The resin used herein may be a single resin or a mixture of two or more different resins.

If the cresol novolac resin has a Mw of less than 2,000, there may be a risk of the pattern being deformed due to volatilization of some low-molecular-weight components in optical/thermal treatment during the subsequent step of forming crosslinks within the resin in the sacrificial film pattern. If the cresol novolac resin has a Mw of more than 30,000, there may be a risk of losing high accuracy in pattern shaping by the lithography.

The content of p-cresol in the cresol reactant is one factor that affects the solubility of the sacrificial film in developer and dictates the resulting pattern shape. If the p-cresol content is less than 40 mol %, the positive film in the unexposed area may become less resistant to developer and prone to lose film thickness during the development step in the lithography pattern-forming process, failing to maintain the film thickness. Also, to adjust the solubility of the resin film in alkaline developer, some phenol groups in the resin may be esterified with ester groups such as methylcarboxyl or ethylcarboxyl.

On the other hand, the cresol novolac resin should preferably have a melting temperature of at least 130° C., more preferably at least 135° C., when the heating step for forming crosslinks within the resin in the sacrificial film pattern is taken into account. If the melting temperature is lower than the range, the heat treatment step may cause thermal deformation to the resin pattern. Then, the cresol novolac resin may contain, in part, a xylenol or trimethylphenol structure for the purpose of adjusting the resin's melting temperature.

The other main component of the sacrificial film-forming composition is a naphthoquinonediazidosulfonic acid ester. It may take the form of a relatively low molecular weight compound in which a compound having a plurality of phenolic hydroxyl groups such as 1,2,3-trihydroxybenzophenone is ester-bonded with a naphthoquinoneazidosulfonic acid chloride such as 1,2-naphthoquinoneazido-5-sulfonic acid chloride, or it may be used in the form ester-bonded with the cresol novolac resin. Many esters are known in the art, and any of them may be generally used herein. The sacrificial film pattern should preferably have a sidewall angle of from 85° to less than 90° so that a finer, more accurate micro-structure may be formed therefrom. In order to process the desired shape from an optically patternable sacrificial film having a thickness of 2 to 20 µm, the film is preferably formed from the composition in which the cresol novolac resin is not only optimized as mentioned above, but also has been esterified with naphthoquinonediazidosulfonic acid because the desired shape is readily available therefrom.

When a naphthoquinonediazidosulfonic acid ester with a low molecular weight is separately used, a 1,2-naphthoquinonediazidosulfonic acid ester having a molecular weight of up to 1,500 is desirable. It is preferably added in an amount of 1 to 33% by weight, more preferably 1 to 25% by weight based on component (A-2) or (A-3).

Examples of suitable naphthoquinonediazidosulfonic acid ester with a low molecular weight include 2,3,4-trihydroxybenzophenone naphthoquinonediazidosulfonate, 2,3,4,4'-tetrahydroxybenzophenone naphthoquinonediazidosulfonate, and 2,2',4,4'-tetrahydroxybenzophenone naphthoquinonediazidosulfonate, but are not limited thereto.

When a naphthoquinonediazidosulfonic acid is used in the form ester bonded with a cresol novolac resin, preference is given to those cresol novolac resins in which 1 to 30 mol %, more preferably 2 to 25 mol % of overall phenolic hydroxyl groups are esterified with 1,2-naphthoquinonediazidosulfonic acid, because a film pattern having a sidewall angle of from 85° to less than 90° is readily available therefrom. If the degree of esterification is less than 1 mol %, the cresol novolac resin itself may have less resistance to developer because the effect of ester bonding is substantially lost. If the degree of esterification is more than 30 mol %, a loss of resin transparency may make it difficult for the pattern sidewall to maintain an angle of at least 85°. As long as the above-indicated problem of light transmittance does not arise, a naphthoquinonediazidosulfonic acid ester with a low molecular weight may be used in combination with a cresol novolac resin having ester-bonded naphthoquinonediazidosulfonic acid.

An amount of component (A-1), (A-2) or (A-3) used is preferably 45 to 98% by weight, more preferably 70 to 98% by weight based on the overall solids weight of the sacrificial film-forming composition.

The sacrificial film-forming composition used in the method for manufacturing a micro-structure according to the invention is formulated by adding to a commonly used cresol novolac-naphthoquinonediazido resist composition a crosslinker capable of forming crosslinks between molecules of the cresol novolac resin in the presence of an acid catalyst. The crosslinker used herein may be any of crosslinkers capable of crosslinking an alkali-soluble resin in a chemically amplified negative resist composition for negative working, for example, melamines, alkoxymethylureas, and alkoxymethylglycolurils. Once the sacrificial film pattern is formed, the crosslinker is activated by the acid which is generated by the naphthoquinonediazidosulfonic acid ester or a separately added acid generator upon second light exposure, whereupon it undergoes electrophilic reaction with phenolic hydroxyl groups or aromatic ring of the cresol novolac resin to form crosslinks, whereby the resin is increased in molecular weight and improved in heat resistance.

With regard to cresol novolac resins, it is known that the resins increase their degree of polymerization under the action of radicals which are liberated from the resin upon light exposure, and that thermal reaction of naphthoquinonediazido forms crosslinks between molecules of the resins. The crosslink formation by the crosslinker is effective for providing more resistance to the heat condition in stage (ii), and the crosslinker is essential for substantially restraining any shape change.

The preferred crosslinker is selected from melamine compounds and glycoluril compounds. The melamine compound is preferably hexamethoxymethylmelamine in monomer and condensate forms. The monomer content is preferably at least 80% by weight, more preferably at least 85% by weight of the total melamine compound. The preferred glycoluril compound used herein is tetrakis(methoxymethyl)glycoluril. Use of these compounds ensures that the resulting resin structure has sufficient heat resistance to allow a temperature in excess of 200° C. to prevail in stage (ii).

To the sacrificial film-forming composition, the crosslinker is preferably added in an amount of 2 to 30% by weight, more preferably 3 to 25% by weight, based on the total solids weight of the composition. If the amount of the crosslinker added is less than 2% by weight, the desired addition effect is not available. If the amount of the crosslinker added is more than 30% by weight, the unexposed area of the resin film may be less resistant to developer during the development step of the lithography process.

In the sacrificial film-forming composition, a PAG having the highest absorption peak in the wavelength range of 200 to 300 nm is added to form effective crosslinks to maintain the pattern profile. Of the PAGs having the highest absorption peak in the wavelength range of 200 to 300 nm, preferred is a PAG having an absorption coefficient ratio $A_{<300}/A_{>300}$ of at least 2.0, more preferably at least 10, and even more preferably at least 100 wherein $A_{<300}$ is an absorption coefficient at a wavelength providing the highest light absorption in a wavelength range of 200 to 300 nm and $A_{>300}$ is an absorption coefficient at a wavelength providing a maximum light absorption in a wavelength range in excess of 300 nm. The ratio is simply defined as a ratio of the absorbance at the absorption maximum in the range of 200 to 300 nm to the maximum absorbance on the long wavelength side in excess of 300 nm. A low absorbance ratio indicates a significant absorption in the wavelength range in excess of 300 nm. If a PAG having such a low absorbance ratio is used, it generates a large amount of acid upon exposure to first high-energy radiation in step (C), and reaction of the crosslinker with the resin is promoted by the thus generated acid, resulting in a low sensitivity or a sensitivity below the practically acceptable level. For this reason, a high absorbance ratio is preferred.

Examples of the preferred PAG include sulfonium salts, iodonium salts, sulfonyldiazomethane and N-sulfonyloxyimide compounds, which will be illustrated below. They may be used alone or in admixture of two or more.

Sulfonium salts are salts of sulfonium cations with sulfonate anions. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonate anions. Exemplary iodonium cations are aryliodonium cations including diphenyliodonium, bis(4-tert-butylphenyl)iodonium, 4-tert-butoxyphenylphenyliodonium, and 4-methoxyphenylphenyliodonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(tert-butylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

Suitable N-sulfonyloxyimide PAGs include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Additionally, other PAGs as listed below are useful. Benzoinsulfonate PAGs include benzoin tosylate, benzoin mesylate, and benzoin butanesulfonate.

Pyrogallol trisulfonate PAGs include pyrogallol, fluoroglycine, catechol, resorcinol, hydroquinone, in which all the hydroxyl groups are substituted with sulfonate groups such as trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate PAGs include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted with a trifluoromethyl group.

Sulfone PAGs include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl) propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable glyoxime derivative PAGs include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, his-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Suitable anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid.

An amount of the PAG added is typically 0.001 to 15% by weight, preferably 0.1 to 15%, more preferably 0.2 to 10%, and even more preferably 0.3 to 7% by weight based on the total solids weight of the sacrificial film-forming composition. If less than 0.001 wt % of the PAG is added, it may be difficult to maintain a sidewall angle effectively in the desired range during the heat treatment step following the exposure to second high-energy radiation. More than 15 wt % of the PAG may lead to a loss of sensitivity because the PAG itself has a low alkaline solubility, indicating that such extra addition of PAG is impractical.

Besides the main components described above, other well-known additives may be added to the sacrificial film-forming composition. For example, dyes and photoacid generators (other than the above PAG) which are effective in a wavelength range of 350 to 450 nm may be added for the purpose of adjusting the sensitivity or sidewall angle of the film pattern. An appropriate addition amount is usually 0 to 10% by weight, and when added, preferably 0.1 to 10% by weight based on the total solids weight of the composition. Suitable dyes include benzophenones such as 1,2,3-trihydroxybenzophenone, curcumine, and azo dyes such as 2-phenyl-azo-4-methylphenol. Even when the sacrificial film pattern is desired to have a sidewall angle of less than 85°, a sacrificial film pattern having the desired sidewall angle can be formed by adjusting the amount of the dye or naphthoquinonediazidosulfonic acid ester.

If necessary, a surfactant may be added to the pattern-forming material for the purpose of improving coating characteristics. Suitable surfactants include nonionic, fluorochemical, and silicone surfactants. An amount of the surfactant is usually 0 to 0.5% by weight, and when added, preferably 0.01 to 0.5%, more preferably 0.01 to 0.3% by weight based on the total solids weight of the composition.

Besides the solid components described above, the sacrificial film-forming composition may further comprise a solvent capable of dissolving the solid components to form a coating solution. A content of the solvent is generally 50 to 90% by weight of the overall composition. Any of well-known solvents commonly used in resists may be used. Suitable solvents include ethylene glycol monoalkyl ethers and acetates thereof, propylene glycol monoalkyl ethers and acetates thereof, diethylene glycol mono- or di-alkyl ethers, alkyl lactates, alkoxypropionic acid alkyl esters, ketones such as methyl isobutyl ketone and cyclohexanone, and acetates such as butyl acetate. These solvents may be used alone or in admixture of two or more.

According to the invention, the stage (i) of forming a sacrificial film pattern starts with step (A) of applying the sacrificial film-forming composition as formulated above onto a substrate to form an optically patternable sacrificial film thereon. The film may be formed by many well-known techniques. Typically, a solution containing the positive photoresist composition may be applied onto a selected substrate by a spin coating, printing or other suitable technique.

In step (B) after coating, heat treatment is carried out at a temperature of about 80 to 130° C. using a hot plate or oven, yielding an optically patternable sacrificial film having a thickness of 2 to 20 μm which is necessary to define a cavity or space in the micro-structure.

Step (C) is to expose patternwise the optically patternable sacrificial film to first high-energy radiation to invite a change of solubility so that the unnecessary portion of the sacrificial film resulting from step (A) may be dissolved away in the subsequent step or development. The first high-energy radiation used in this patternwise exposure is not particularly limited as long as the naphthoquinonediazidosulfonic acid ester is sensitive thereto. The preferred high-energy radiation is UV radiation in the range of 350 to 450 nm. The optimum exposure dose is determined depending on a particular sacrificial film used. After an optimum exposure dose necessary for pattern formation is previously determined, the film is exposed to a pattern of radiation in the optimum dose.

Step (D) is to develop the sacrificial film with an alkaline developer to form a positive sacrificial film pattern. Specifically, the portion of the sacrificial film which has been exposed to high-energy radiation in step (C) is dissolved away using an aqueous alkaline developer. The aqueous alkaline developer is typically an aqueous solution of tetramethylammonium hydroxide (TMAH) in a concentration of 1.0 to 3.5% by weight, preferably 1.3 to 3.0% by weight. Through this development, the portion of the resin film which has been exposed to UV radiation is dissolved away, leaving the desired sacrificial film pattern. The aqueous alkaline developer used herein is not limited to the organic developer described just above. It is not prohibited to use an inorganic developer based on KOH, for example, as long as the desired development rate is achievable. In this sense, any aqueous alkaline developer may be used.

Step (E) is intended to provide the sacrificial film pattern with heat resistance so that high temperature conditions may be applied in stage (ii). To this end, step (E) includes exposing the sacrificial film pattern to second high-energy radiation which is UV radiation covering a wavelength of 254 nm. In one embodiment of step (E), the sacrificial film pattern may be exposed to UV radiation covering a wavelength of 254 nm while heating at a temperature in the range of 30 to 220° C. In another embodiment of step (E), the sacrificial film pattern may be exposed to UV radiation covering a wavelength of 254 nm and then heated at a temperature in the range of 100 to 220° C. In a further embodiment of step (E), the sacrificial film pattern may be exposed to UV radiation covering a wavelength of 254 nm while heating at a temperature in the range of 30 to 220° C., and then further heated at a temperature in the range of 100 to 220° C. In any embodiment, the exposure and heat treatment cause to form crosslinks between molecules of the cresol novolac resin in the sacrificial film pattern.

Exposure to second high-energy radiation is exposure to UV radiation covering a wavelength of 254 nm. Upon exposure to such UV, the PAG generates an acid and the unreacted naphthoquinonediazidosulfonic acid ester generates an acid. The acids thus generated act to create cations at plural activation sites of the crosslinker, typically melamine, triggering electrophilic substitution reaction on hydroxyl group or aromatic ring of the cresol novolac resin to form crosslinks in the cresol novolac resin.

The irradiation of second high-energy radiation may be flood exposure over the entire substrate. Therefore, the second high-energy radiation may be either single UV having a wavelength of 254 nm or a broad band of UV covering a wavelength of 254 nm. Crosslink formation may be facilitated by heating the substrate at a temperature in the range of 30 to 220° C. during the exposure. The heating may be single stage heating or multi-stage heating. Although the exposure dose of second high-energy radiation is not particularly limited, the exposure dose for effective crosslink formation preferably corresponds to an energy amount which is 0.5 to 1,000 times, more preferably 5 to 500 times, and even more preferably 10 to 100 times the energy amount used in the exposure to first high-energy radiation.

After the irradiation of second high-energy radiation, heat treatment is optionally carried out at a temperature of 100 to 220° C. in order to promote crosslinking reaction. In the heating step following the high-energy radiation irradiation, a heating device such as a hot plate or oven is typically used, although the heating means is not particularly limited. The heat treatment may be at a single stage or multiple stages. For example, in the case of heating at or above 160° C., a stage of heating at a temperature below 160° C. may be followed by a stage of heating at a temperature of at least 160° C. because such staged heating is more effective for preventing deformation of the pattern profile.

Since the crosslink formation with the aid of PAG and crosslinker ensures efficient introduction of crosslinks, high heat resistance is more readily established. Even when the sacrificial film pattern resulting from step (E) wherein the structure has a sidewall angle from 85° to less than 90° is exposed to heat of 200° C., for example, it experiences a minimized profile change.

Once the sacrificial film pattern is formed as described above, it is overlaid with an inorganic material film. Examples of the inorganic material film include amorphous silicon film and silicon oxide film. The method for forming the inorganic material film may be physical vapor deposition (PVD), typically sputtering or chemical vapor deposition (CVD). In particular, the CVD of amorphous silicon is preferred because a uniform inorganic material film can be easily formed. Since the CVD technique has a propensity that the temperature of the substrate surface rises above 200° C., the invention is advantageous under such circumstances. The inorganic material film preferably has a thickness of 0.1 to 2 μm, more preferably 0.3 to 1 μm, although the film thickness varies depending on the intended device.

Typically, the inorganic material film deposited on the sacrificial film pattern which maintains its profile at a high accuracy is then additionally processed or shaped, depending on a particular purpose. At this point, the inorganic material film is partially provided with apertures for etching away the sacrificial film pattern. The method for forming apertures may be selected as appropriate depending on the function and shape of the intended device. The apertures may be formed by any well-known techniques, for example, a lithography process using a photoresist composition to form apertures or through-holes, and peeling of top surface by chemical mechanical polishing (CMP).

Then the sacrificial film pattern is etched away through the apertures, completing a space having the contour of the sacrificial film pattern.

Since the sacrificial film is made of a cresol novolac resin based material, it may be readily removed by any of wet and dry etching techniques as used in the removal of a conventional cresol novolac resin-based negative resist composition. Advantageously, the sacrificial film may be removed by oxygen plasma ashing, that is a simple technique having no impact on the inorganic material film.

EXAMPLE

Examples and Comparative Examples are given below for further illustrating the invention although the invention is not limited thereto. Note that Mw is a weight average molecular weight as measured by gel permeation chromatography (GPC) versus polystyrene standards. The absorption coefficient ratio $A_{<300}/A_{>300}$ of a PAG is determined by measuring an absorption coefficient over a wavelength range of 200 to 600 nm by means of a spectrophotometer U-3000 (Hitachi High-Technologies Corp.), obtaining absorption peaks in the ranges of 200 to 300 nm and more than 300 nm, and calculating a ratio.

A melting temperature or glass transition point was measured by using a differential thermal calorimeter "Thermoplus DSC-8230" available from Rigaku Co., Ltd.

Photosensitive Resin Synthesis Example 1

A flask equipped with a stirrer, nitrogen purge tube and thermometer was charged with 120 g of a cresol novolac resin containing 50 mol % of p-cresol and 50 mol % of m-cresol and having a melting temperature of 145° C. and Mw of 4,500, 8.1 g of 1,2-naphthoquinone-2-diazido-5-sulfonyl chloride (corresponding to 3 mol % based on phenolic hydroxyl groups in the resin), and 500 g of 1,4-dioxane, which were stirred until uniform. To the solution at room temperature, 10.6 g of triethylamine was added dropwise. At the end of dropwise addition, stirring was continued for 1 hour. The reaction solution was poured into a large volume of 0.1N hydrochloric acid solution whereupon the precipitating resin was recovered. The resin was dried in a vacuum dryer, obtaining 130 g of a novolac resin (1) which was partially esterified with 1,2-naphthoquinone-2-diazido-5-sulfonyl as the desired photosensitive resin. The total content of the novolac resin in the photosensitive resin was 92% by weight.

Photosensitive Resin Synthesis Example 2

A novolac resin was prepared by the same procedure as Photosensitive Resin Synthesis Example 1 aside from using 120 g of a cresol novolac resin containing 55 mol % of p-cresol and 45 mol % of m-cresol and having a melting temperature of 149° C. and Mw of 10,000, and 16.1 g of 1,2-naphthoquinone-2-diazido-5-sulfonyl chloride (corresponding to 6 mol % based on phenolic hydroxyl groups in the resin). The total content of the novolac resin in the photosensitive resin was 85% by weight.

Photosensitive Resin Synthesis Example 3

A novolac resin was prepared by the same procedure as Photosensitive Resin Synthesis Example 1 aside from using 120 g of a cresol novolac resin containing 45 mol % of p-cresol and 55 mol % of m-cresol and having a melting temperature of 143° C. and Mw of 6,000, and 32.2 g of 1,2-naphthoquinone-2-diazido-5-sulfonyl chloride (corresponding to 12 mol % based on phenolic hydroxyl groups in the resin). The total content of the novolac resin in the photosensitive resin was 77% by weight.

Preparation of Optically Patternable Sacrificial Film-Forming Composition

Example 1

A pattern-forming composition #1 was prepared by dissolving 33.17 g of the cresol novolac resin obtained in Photosensitive Resin Synthesis Example 1, 6.63 g of hexamethoxymethylmelamine (CL1) having a monomer concentration of 97 wt %, 2.84 g of p-toluenesulfonic acid triphenylsulfonate (PAG1, $A_{<300}/A_{>300}>1,500$) which had the maximum absorption peak at a wavelength range of 200 to 300 nm, 0.47 g of a naphthoquinonediazidosulfonic acid ester in which three hydroxyl groups of 1,2,3-trihydroxybenzophenone form ester bonds with 1,2-naphthoquinoneazido-5-sulfonic acid (NT-300P by Toyo Gosei Co., Ltd.), and 0.01 g of a surfactant X-70-093 in 56.87 g of ethyl lactate, and filtering the resulting solution through a filter having a pore size of 0.2 μm.

It is noted that X-70-093 is the trade name of a fluorinated silicone surfactant commercially available from Shin-Etsu Chemical Co., Ltd.

Example 2

A pattern-forming composition #2 was prepared by dissolving 35.89 g of the cresol novolac resin obtained in Photosensitive Resin Synthesis Example 1, 1.54 g of CL1, 1.03 g of nonafluorobutanesulfonic acid triphenylsulfonate (PAG2, $A_{<300}/A_{>300}>1,500$) which had the maximum absorption peak at a wavelength range of 200 to 300 nm, and 0.01 g of surfactant X-70-093 in 61.53 g of ethyl lactate, and filtering the resulting solution through a filter having a pore size of 0.2 μm.

Example 3

A pattern-forming composition #3 was prepared by dissolving 35.35 g of the cresol novolac resin obtained in Photosensitive Resin Synthesis Example 2, 3.03 g of CL1, 1.01 g of (1-methylpropylsulfonyl)diazomethane (PAG3, $A_{<300}/A_{>300}=300$) which had the maximum absorption peak at a wavelength range of 200 to 300 nm, and 0.01 g of surfactant X-70-093 in 60.60 g of ethyl lactate, and filtering the resulting solution through a filter having a pore size of 0.2 μm.

Example 4

A pattern-forming composition #4 was prepared by dissolving 32.26 g of the cresol novolac resin obtained in Photosensitive Resin Synthesis Example 3, 6.45 g of CL1, 1.38 g of PAG3, 4.61 g of a naphthoquinonediazidosulfonic acid ester in which three hydroxyl groups of 1,2,3-trihydroxybenzophenone form ester bonds with 1,2-naphthoquinoneazido-5-sulfonic acid, and 0.01 g of surfactant X-70-093 in 55.29 g of ethyl lactate, and filtering the resulting solution through a filter having a pore size of 0.2 μm.

Example 5

A pattern-forming composition #5 was prepared by dissolving 33.33 g of the cresol novolac resin obtained in Photosensitive Resin Synthesis Example 3, 6.67 g of CL1, 2.86 g of PAG1, and 0.01 g of surfactant X-70-093 in 57.14 g of ethyl lactate, and filtering the resulting solution through a filter having a pore size of 0.2 μm.

Example 6

The sacrificial film-forming composition #1 of Example 1 was spin coated onto a silicon wafer and prebaked on a hot plate at 100° C. for 120 seconds to form a film of 5 μm thick. The film-bearing wafer was exposed by means of an i-line stepper NSR-1755i7A (Nikon Corp., monochromatic light of 365 nm), developed with a 2.38 wt % tetramethylammonium hydroxide aqueous solution for 100 seconds, rinsed with deionized water for 30 seconds, and spin dried. The exposure dose was 100 mJ/cm$^2$, and a line-and-space pattern of 5 microns (μm) could be formed. By the same procedure as above, a line-and-space pattern of 10 μm was formed. Both the L/S patterns of 5 μm and 10 μm had a sidewall angle of 89° when an angle of a resist sidewall relative to the substrate was measured in a pattern cross-sectional profile observed under a field-emission scanning electron microscope S-4700 (Hitachi High-Technologies Corp.). Herein patterns of two sizes were used for evaluation because a change of shape the pattern would experience after the exposure to second high-energy radiation and cure might depend on the pattern size. Notably, film thickness was measured by an optical thickness meter.

The pattern-bearing wafers were exposed to second high-energy radiation from the lamp unit of system UMA-802-HC551TZ (Ushio Inc., UV covering 254 nm) at an illuminance of 20 mW/cm$^2$ for 400 seconds while heating at 50° C. Following exposure, the wafers were heat treated in an oven at 150° C. for 30 minutes and then at 200° C. for 30 minutes, one hour in total, yielding wafers for surface micromachining. Following exposure to second high-energy radiation, the 5-micron pattern had a sidewall angle of 88° and the 10-micron pattern had a sidewall angle of 89°.

In a test, these wafers were subjected to heat treatment at 250° C. for 30 minutes, which was a simulation of formation of an inorganic material film by plasma-enhanced CVD. After the heat treatment, the film thickness was measured, finding that the thickness remained unchanged and the pattern sidewall angle remained unchanged.

On the pattern-bearing wafers following the heat treatment, amorphous silicon was deposited. Using a plasma-enhanced CVD system (PD-220 by Samuco Co.), an amorphous silicon film of 0.4 μm thick was deposited on the L/S pattern-bearing substrate by heat treatment at 250° C. for 30 minutes. An observation of the pattern sidewall under SEM S-4700 showed that the silicon film could be successfully deposited without defects in the pattern sidewall.

Further, an i-line exposure positive resist composition based on a common cresol novolac resin (SIPR-9740 by Shin-Etsu Chemical Co., Ltd.) was coated onto the amorphous silicon film on the sacrificial film pattern to form a photoresist film of 2 μm thick, which was patterned. Using the photoresist pattern as mask, fluorine plasma etching with SF$_6$ was carried out, whereby apertures penetrating to the sacrificial film pattern were defined in the amorphous silicon film. Thereafter, the pattern of resist SIPR-9740 was dissolved away in acetone. This was followed by ashing with oxygen plasma by the RF plasma process for 10 minutes. When observed under SEM S-4700, the substrate had no residues on its surface, proving that the resin film which had been heat treated at 250° C. could be readily removed.

The data demonstrate that the sacrificial film pattern formed by the inventive method has adequate properties for surface micromachining of an inorganic film or the like by the sacrificial layer etching technique.

In Examples 7 and 8, the sacrificial film-forming compositions #2 and #3 of Examples 2 and 3 were subjected to the same experiment as in Example 6, with the results shown in Table 1.

In Examples 9 and 10, the sacrificial film-forming compositions #4 and #5 of Examples 4 and 5 were subjected to the same experiment as in Example 6 except that the exposure to second high-energy radiation was to irradiate radiation from UBX601-03 (Iwasaki Electric Co., Ltd., UV covering 254 nm) in a dose of 8,000 mJ/cm$^2$ without heating at 50° C. The subsequent steps were the same as in Example 6. The results are also shown in Table 1.

TABLE 1

| | Example | | | | |
|---|---|---|---|---|---|
| | 6 | 7 | 8 | 9 | 10 |
| Composition | #1 | #2 | #3 | #4 | #5 |
| Dose of first high-energy radiation (mJ/cm$^2$) | 100 | 120 | 140 | 450 | 380 |
| 10-μm pattern sidewall angle (°) | 89 | 90 | 90 | 87 | 89 |
| 5-μm pattern sidewall angle (°) | 89 | 90 | 90 | 87 | 89 |
| 10-μm pattern sidewall angle (°) after second high-energy radiation + oven treatment | 89 | 88 | 88 | 86 | 88 |
| 5-μm pattern sidewall angle (°) after second high-energy radiation + oven treatment | 88 | 87 | 88 | 86 | 87 |
| Defects in amorphous silicon film | no defects | no defects | no defects | no defects | no defects |
| Film removal | good | good | good | good | good |

Comparative Examples 1 to 5

The compositions #1 to #5 of Examples 1 to 5 were subjected to the same experiment as in Example 6 except that the exposure to second high-energy radiation was to irradiate radiation from i-line stepper NSR-1755i7A (Nikon Corp.) in a dose of 8,000 mJ/cm$^2$. The subsequent oven treatment was the same as in Example 6. The results of sidewall angle are shown in Table 2.

TABLE 2

| | Comparative Example | | | | |
|---|---|---|---|---|---|
| | 1 | 2 | 3 | 4 | 5 |
| Composition | #1 | #2 | #3 | #4 | #5 |
| 10-μm pattern sidewall angle (°) | 83 | 84 | 84 | 81 | 83 |
| 5-μm pattern sidewall angle (°) | 83 | 84 | 84 | 81 | 83 |

Comparative Examples 6 to 9

Compositions of the formulation shown in Table 3 were prepared and subjected to the same experiment as in Example 6.

TABLE 3

| | Comparative Example | |
|---|---|---|
| | 6 | 7 |
| Photosensitive resin | Synthesis Example 2 | Synthesis Example 3 |
| Naphthoquinonediazidosulfonyl compound | NT-300P (2) | — |
| Crosslinker | — | CL1 (5) |
| PAG | PAG2 (5) | — |
| Solvent | ethyl lactate | ethyl lactate |

The value in parentheses is % by weight based on the weight (100 wt %) of photosensitive resin.

The results of evaluation are shown in Table 4.

TABLE 4

| | Comparative Example | |
|---|---|---|
| | 8 | 9 |
| Composition | #6 | #7 |
| Dose of first high-energy radiation (mJ/cm$^2$) | 160 | 430 |
| 10-μm pattern sidewall angle (°) | 90 | 89 |
| 5-μm pattern sidewall angle (°) | 90 | 89 |
| 10-μm pattern sidewall angle (°) after second high-energy radiation + oven treatment | 75 | 83 |
| 5-μm pattern sidewall angle (°) after second high-energy radiation + oven treatment | 75 | 83 |
| Defects in amorphous silicon film | no defects | no defects |
| Film removal | good | good |

According to the invention, a resin structure suited for sacrificial layer etching, which is an important technique for surface micromachining, can be formed on a substrate by a simple method and be advantageously utilized in the process for manufacturing MEMS elements or the like.

The invention is not limited to the foregoing Examples because they are merely given by way of illustration. The invention includes all embodiments having substantially the same construction and the same effect as the technical concept set forth in the appended claims.

Japanese Patent Application No. 2011-113676 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A sacrificial film pattern having a sidewall which is forward tapered at an angle from 85° to less than 90° relative to the substrate, and formed from a positive novolac resist composition comprising
    (A-1) (i) a cresol novolac resin consisting of at least 40 mol % of p-cresol and the remainder of m-cresol and having some or all phenolic hydroxyl groups esterified with 1,2-naphthoquinonediazidosulfonic acid halide, or
    (ii) a mixture of a cresol novolac resin consisting of at least 40 mol % of p-cresol and the remainder of m-cresol and having some or all phenolic hydroxyl groups esterified with 1,2-naphthoquinonediazidosulfonic acid halide and a cresol novolac resin having phenolic hydroxyl groups non-esterified,
    a crosslinker capable of forming crosslinks within the cresol novolac resin in the presence of an acid catalyst, and
    a photoacid generator having the highest absorption peak in the wavelength range of 200 to 300 nm and selected from the group consisting of sulfonium salts, iodonium salts, sulfonyldiazomethane and N-sulfonyloxyimide compounds.

2. The pattern of claim 1 wherein the cresol novolac resin in (A-1) has a weight average molecular weight of 2,000 to 30,000 and a melting temperature of at least 130° C.

3. The pattern of claim 1 wherein the cresol novolac resin having some or all phenolic hydroxyl groups esterified with 1,2-naphthoquinonediazidosulfonic acid halide is a cresol novolac resin in which 0.5 to 30 mol % of phenolic hydroxyl groups are esterified with 1,2-naphthoquinonediazidosulfonic acid halide.

4. The pattern of claim 1 wherein the composition comprises 45 to 98% by weight of component (A-1), based on the total solids weight of the composition, and
    the total of the esterified cresol novolac resin and the non-esterified cresol novolac resin is at least 67% by weight of component (A-1).

5. The pattern of claim 1 wherein said crosslinker is a melamine compound and the composition comprises 2 to 30% by weight of the melamine compound based on the total solids weight of the composition.

6. The pattern of claim 5 wherein the melamine compound comprises at least 80% by weight of a hexamethoxymethylmelamine monomer.

7. The pattern of claim 1 wherein said photoacid generator having the highest absorption peak in the wavelength range of 200 to 300 nm comprises a photoacid generator having an absorption coefficient ratio $A_{<300}/A_{>300}$ of at least 2.0 wherein $A_{<300}$ is an absorption coefficient at a wavelength providing the highest light absorption in the wavelength range of 200 to 300 nm and $A_{>300}$ is an absorption coefficient at a wavelength providing a maximum light absorption in a wavelength range in excess of 300 nm.

8. The pattern of claim 1 wherein the sacrificial film has a thickness of 2 to 20 μm.

9. A sacrificial film pattern having a sidewall which is forward tapered at an angle from 85° to less than 90° relative to the substrate, and formed from a positive novolac resist composition consisting essentially of
    70 to less than 98% by weight of (A-1) (i) a cresol novolac resin consisting of at least 40 mol % of p-cresol and the remainder of m-cresol and having some or all phenolic hydroxyl groups esterified with 1,2-naphthoquinonediazidosulfonic acid halide,
    2 to 25% by weight of a crosslinker capable of forming crosslinks within the cresol novolac resin in the presence of an acid catalyst,
    0.001 to 15% by weight of a photoacid generator having the highest absorption peak in the wavelength range of 200 to 300 nm and selected from the group consisting of sulfonium salts, iodonium salts, sulfonyldiazomethane and N-sulfonyloxyimide compounds, and
    0 to 0.5% by weight of a surfactant.

10. A sacrificial film pattern having a sidewall which is forward tapered at an angle from 85° to less than 90° relative to the substrate, and formed from a positive novolac resist composition consisting essentially of
    70 to less than 98% by weight of (A-1) (i) a cresol novolac resin consisting of at least 40 mol % of p-cresol and the remainder of m-cresol and having some or all phenolic hydroxyl groups esterified with 1,2-naphthoquinonediazidosulfonic acid halide,
    2 to 25% by weight of a crosslinker capable of forming crosslinks within the cresol novolac resin in the presence of an acid catalyst,
    0.001 to 15% by weight of a photoacid generator having the highest absorption peak in the wavelength range of 200 to 300 nm and selected from the group consisting of sulfonium salts, iodonium salts, sulfonyldiazomethane and N-sulfonyloxyimide compounds, and
    0 to 0.5% by weight of a surfactant,
    wherein the cresol novolac resin in (A-1) has a weight average molecular weight of 2,000 to 30,000 and a melting temperature of at least 130° C., and
    the cresol novolac resin having some or all phenolic hydroxyl groups esterified with 1,2-naphthaoquinonediazidosulfonic acid halide is a cresol novolac resin in which 0.5 to 30 mol % of phenolic hydroxyl groups are esterified with 1,2-naphthoquinonediazidosulfonic acid halide, and
    wherein said crosslinker is a melamine compound and the composition comprises 2 to 30% by weight of the melamine compound based on the total solids weight of the composition.

* * * * *